United States Patent
Chang et al.

(10) Patent No.: US 6,975,956 B2
(45) Date of Patent: Dec. 13, 2005

(54) MULTIPLE SWEEP POINT TESTING OF CIRCUIT DEVICES

(75) Inventors: Timothy C. Chang, Saratoga, CA (US); Donald C. Stark, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 111 days.

(21) Appl. No.: 10/247,188

(22) Filed: Sep. 19, 2002

(65) Prior Publication Data

US 2004/0059536 A1 Mar. 25, 2004

(51) Int. Cl.$^7$ .............................................. G06F 19/00
(52) U.S. Cl. ...................................................... 702/120
(58) Field of Search ........................... 702/120, 84, 72; 714/28, 726, 738, 739, 729, 718, 35, 724, 8; 370/462, 401, 419; 600/441; 324/754; 708/230; 365/202, 201; 340/241; 710/317

(56) References Cited

U.S. PATENT DOCUMENTS

| | | | |
|---|---|---|---|
| 6,014,764 A | * | 1/2000 | Graeve et al. ............... 714/738 |
| 6,567,942 B1 | * | 5/2003 | Shepard, III ................. 714/726 |
| 2004/0168104 A1 | * | 8/2004 | Whetsel ........................ 714/28 |

* cited by examiner

*Primary Examiner*—Michael Nghiem
*Assistant Examiner*—Tung S. Lau

(57) ABSTRACT

An efficient method and apparatus for characterizing circuit devices is disclosed. In one embodiment, multiple test patterns for testing a circuit device are stored in a tester. Each test pattern includes both test data and control data that defines at least in part a sweep point at which the circuit device is tested. Thus, the tester can generate stimulus vectors for multiple sweep points without requiring control system intervention. Pass/fail indicators, each of which represents pass/fail results associated with a sweep point, are derived from the test results and stored in a Fail Capture Memory. A pass/fail boundary of the DUT can be determined from the contents of the Fail Capture Memory.

51 Claims, 13 Drawing Sheets

| Vector number | command | I N 0 | I N 1 | I N 2 | I N 3 | I N 4 | I O 0 | I O 1 | I O 2 | I O 3 | I O 4 | S I G 3 | S I G 2 | S I G 1 | S I G 0 | T R I G |
|---|---|---|---|---|---|---|---|---|---|---|---|---|---|---|---|---|
| 000000 | inc | 0 | 0 | 0 | 0 | 0 | 0 | 0 | 0 | 0 | 0 | 0 | 0 | 0 | 0 | |
| 000001 | inc | 1 | 0 | 0 | 0 | 0 | 0 | 0 | 0 | 0 | 0 | 0 | 0 | 0 | 0 | |
| 000002 | rept 10 | 0 | 0 | 0 | 0 | 0 | 0 | 0 | 0 | 0 | 0 | 0 | 0 | 0 | 0 | |
| 000003 | inc | 1 | 0 | 0 | 0 | 0 | 0 | 0 | 0 | 0 | 0 | 0 | 0 | 0 | 0 | |
| 000004 | inc | 0 | 1 | 1 | 1 | 1 | 0 | 0 | 0 | 0 | 0 | 0 | 0 | 0 | 0 | |
| 000005 | inc | 1 | 1 | 1 | 1 | 1 | 0 | 0 | 0 | 0 | 0 | 0 | 0 | 0 | 0 | |
| 000006 | inc | 0 | 0 | 1 | 0 | 1 | 0 | 0 | 0 | 0 | 0 | 0 | 0 | 0 | 0 | |
| 000007 | inc | 1 | 0 | 1 | 0 | 1 | 0 | 0 | 0 | 0 | 0 | 0 | 0 | 0 | 0 | |
| 000008 | inc | 0 | 0 | 1 | 0 | 1 | 0 | 0 | 0 | 0 | 0 | 0 | 0 | 0 | 0 | |
| 000009 | inc | 1 | 0 | 0 | 0 | 1 | 0 | 0 | 0 | 0 | 0 | 0 | 0 | 0 | 0 | |
| 000010 | inc | 0 | 0 | 0 | 0 | 1 | 0 | 0 | 0 | 0 | 0 | 0 | 0 | 0 | 0 | |
| 000011 | inc | 1 | 0 | 0 | 0 | 1 | 0 | 0 | 0 | 0 | 0 | 0 | 0 | 0 | 0 | |
| 000012 | inc | 0 | 0 | 0 | 0 | 0 | 0 | 0 | 0 | 0 | 0 | 0 | 0 | 0 | 0 | |
| . | | | | | | | | | | | | | | | | |
| 000100 | inc | 1 | 0 | 0 | 0 | 0 | 0 | 0 | 0 | 0 | 0 | 0 | 0 | 0 | 1 | |
| 000101 | inc | 0 | 0 | 0 | 0 | 0 | 1 | 0 | 1 | 0 | 1 | 0 | 0 | 0 | 0 | |
| 000102 | inc | 1 | 0 | 0 | 0 | 0 | 1 | 0 | 1 | 0 | 1 | 0 | 0 | 0 | 0 | |
| 000103 | inc | 0 | 0 | 0 | 0 | 0 | 1 | 1 | 1 | 1 | 1 | 0 | 0 | 0 | 0 | |
| 000104 | inc | 1 | 0 | 0 | 0 | 0 | 1 | 1 | 1 | 1 | 1 | 0 | 0 | 0 | 0 | |
| 000105 | inc | 0 | 0 | 0 | 0 | 0 | L | L | L | L | L | 0 | 0 | 1 | 0 | |
| 000106 | inc | 1 | 0 | 0 | 0 | 0 | L | L | L | L | L | 0 | 0 | 1 | 0 | |
| 000107 | inc | 0 | 0 | 0 | 0 | 0 | H | L | H | L | H | 0 | 0 | 1 | 0 | |
| 000108 | inc | 1 | 0 | 0 | 0 | 0 | H | L | H | L | H | 0 | 0 | 1 | 0 | |
| 000109 | inc | 0 | 0 | 0 | 0 | 0 | H | H | H | H | H | 0 | 0 | 1 | 0 | |
| 000110 | inc | 1 | 0 | 0 | 0 | 0 | H | H | H | H | H | 0 | 0 | 1 | 0 | |
| 000111 | inc | 0 | 0 | 0 | 0 | 0 | L | L | L | L | L | 0 | 0 | 1 | 0 | |
| . | | | | | | | | | | | | | | | | |
| 009999 | inc | 0 | 0 | 0 | 0 | 0 | L | L | L | L | L | 0 | 0 | 1 | 0 | |

Fig. 11

MULTIPLE SWEEP POINT TESTING OF CIRCUIT DEVICES

BRIEF DESCRIPTION OF THE INVENTION

The present invention relates generally to testing and characterization of circuit devices. More specifically, the present invention relates to methods and apparatuses for performing sweep tests on circuit devices.

BACKGROUND OF THE INVENTION

In general, integrated circuit devices are tested or characterized during or after manufacturing to verify their functionality under various operating conditions. Such testing or characterization is usually performed by using Automatic Test Equipment (ATE). A typical ATE system includes a tester that has a number of hardware resources for performing specific functions, such as data generation, timing generation, voltage level generation, and data collection, etc. A processor/controller is typically used to program and control the tester hardware resources.

In some ATE systems, when performing sweep tests (e.g., timing sweeps, voltage level sweeps), the controller first programs the tester hardware resources with device parameter values that are associated with a particular test condition, or "sweep point." The controller also provides the tester with a test pattern that can be used to verify a particular function of the device under test (DUT) at that sweep point. The tester then generates stimuli based on the test pattern and the device parameter values, applies the stimuli to the DUT and collects the responses of the DUT. Thereafter, the controller interrupts the tester to read the responses and to reprogram the tester hardware resources with device parameter values that correspond to another sweep point. This process is oftentimes repeated for a large number of sweep points. When tests covering all sweep points within a predefined sweep range are performed, a pass-fail boundary for the device can be extracted from the collected data. A decision to reject the DUT or to select an appropriate "bin" for the DUT can be made based on the pass fail boundary.

Depending on the length of the data stream used for each test, a disproportionate amount of time may be needed to reprogram the tester hardware resources. For example, the tester needs only 1.25 ms to apply a 1 Mbit stimulus at a data rate of 800 Mbps to the DUT. But it may take the controller up to 100 ms or more to interrupt the tester, to reprogram the tester hardware resources with new test patterns or new device parameter values, and to restart the stimulus burst. Because many sweep points are tested to fully characterize an integrated circuit device, the cumulative effect of this inefficiency is significant.

Accordingly, what is needed is an improved method and apparatus for testing or characterizing circuit devices.

BRIEF DESCRIPTION OF THE DRAWINGS

Aspects of the present invention will be apparent from the following description and appended claims when taken in conjunction with the accompanying drawings, in which:

FIG. 11 depicts a portion of an example test pattern according to one embodiment of the present invention.

DESCRIPTION OF THE INVENTION

Preferred embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention provides an efficient method and apparatus for performing sweep tests on circuit devices. A "sweep test" herein refers to a procedure where a circuit device is tested under multiple test conditions ("sweep points") that typically involve one or more variables ("sweep values"). In one embodiment, multiple test patterns for testing a circuit device are stored in a tester. Each test pattern includes, in addition to test data, control data that defines at least in part a sweep point (e.g., a test condition of a sweep test) at which the circuit device is tested. Thus, the tester can generate stimulus vectors for multiple sweep points without requiring control system intervention.

In one embodiment, the present invention is applicable to a circuit device that has one or more internal registers for controlling its own operational parameters; and adjusting these operational parameters is tantamount to changing the sweep values. In this embodiment, the test patterns each include control data for causing control values to be stored in the internal registers so as to adjust the device's operational parameters for each sweep point. In another embodiment, the test patterns each include control data for adjusting the hardware resources of the tester for each sweep point.

According to one aspect of the present invention, a Fail Capture Memory (FCM) is provided to store the test results temporarily. In one particular embodiment, the FCM stores test results for each sweep point. A pass/fail boundary of the circuit device can be determined from the contents of the FCM. In this way, test results of each sweep do not have to be reported to the controller during the sweep, resulting in further reduction of control system intervention. In one embodiment, the FCM can be addressed in accordance with the sweep values. In another embodiment, the FCM can be addressed by a counter that increments once for every sweep point. In yet another embodiment, the FCM stores data related only to sweep points where failures occur.

Figure 1:
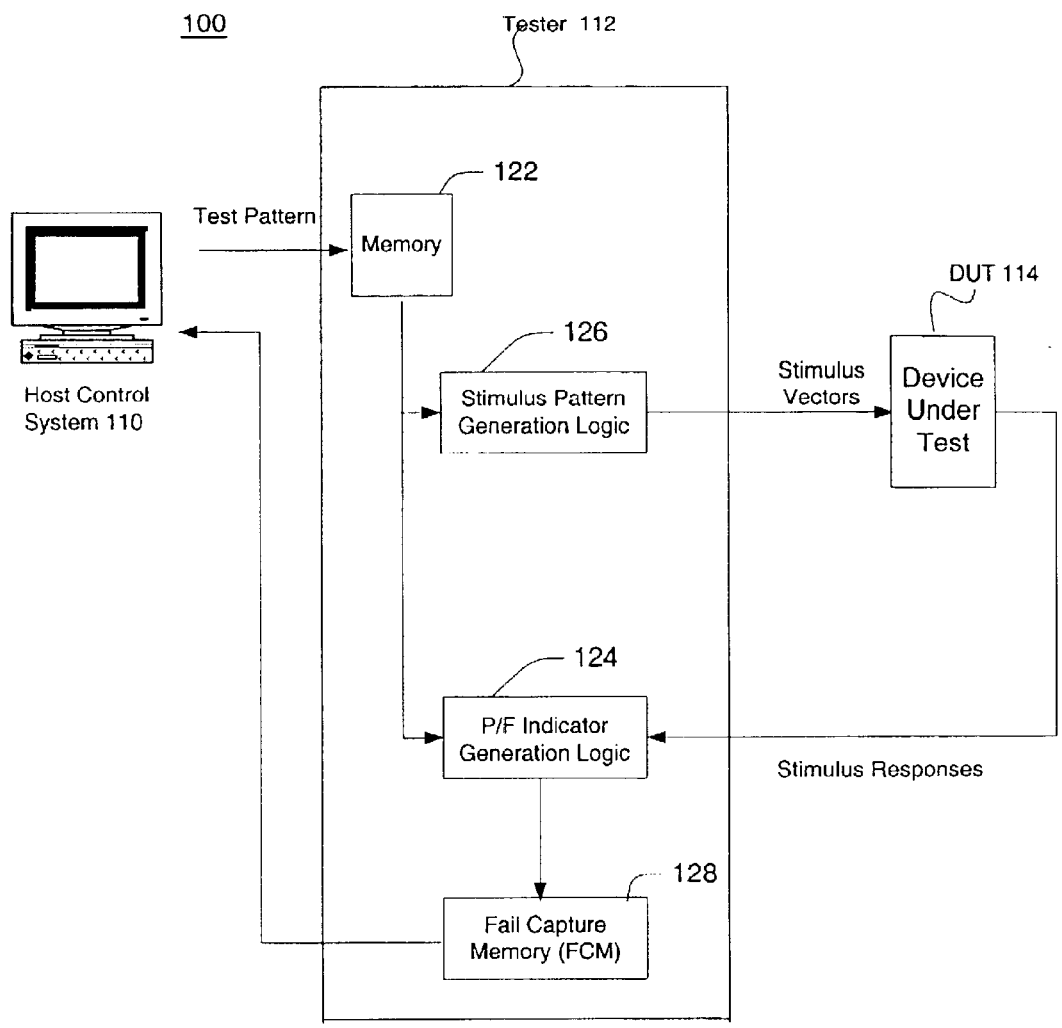
FIG. 1 shows an automatic test system according to one embodiment of the present invention.

FIG. 1 is a block diagram of a circuit device testing system 100 according to one embodiment of the present invention. The circuit device testing system 100 includes a tester 112 and a control system 110, which can be a computer workstation. Also shown is a circuit device under test (DUT) 114. A robotic handling system (not shown), which may be controlled by the control system 110, may be used to position the DUT 114 to make contact with numerous test probes on the tester 112.

The circuit device testing system 100 is suitable for testing DUTs whose operational parameters can be programmably controlled. Some integrated circuit devices having internal circuitry for programmably altering the devices' operational parameters are described, for example, in U.S. Pat. No. 5,945,862, entitled "Circuitry for the Delay Adjustment of a Clock Signal", U.S. Pat. No. 6,125,157, entitled "Delay Locked Loop Circuitry for Clock Delay Adjustment," and U.S. Pat. No. 6,198,307, entitled "Output Driver Circuit with Well-Controlled Output Impedance," all of which are hereby incorporated by reference. In some particular designs, the circuit devices include registers that can be programmed and logic for using the contents of the registers to alter the device's operational parameters, such as clock delay or output impedance. The DUT 114, which contains internal registers for storing parameter values and logic for using the parameter values to alter its operational parameters, is one such integrated circuit device. For simplicity, operational parameters of an integrated circuit device that can be programmably controlled are referred to herein as "programmable parameters." Furthermore, values that are stored within internal registers of an integrated circuit device for defining at least partially the device's programmable parameters are herein referred to as "control values."

Figure 2:
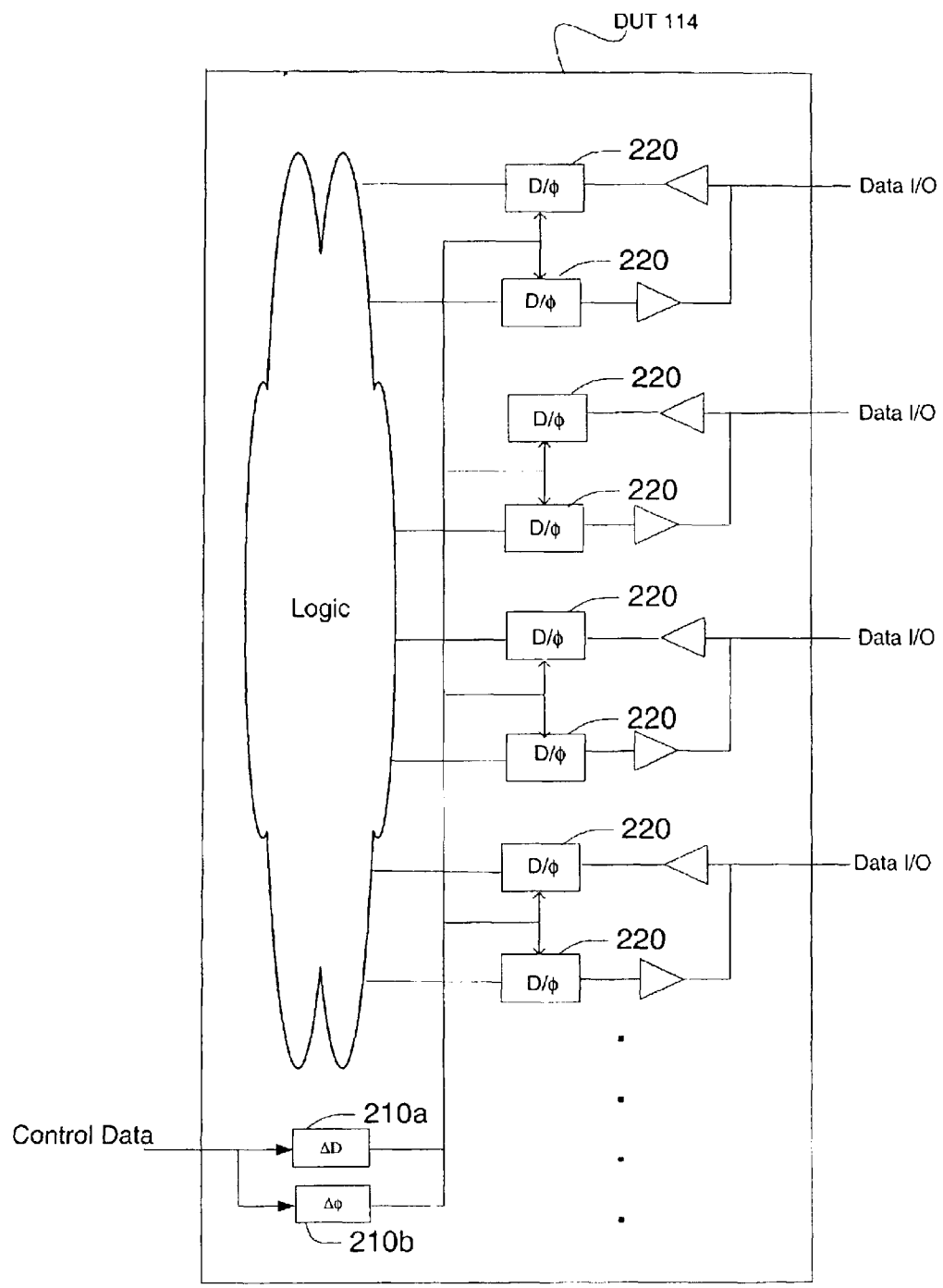
FIG. 2 shows a block diagram of one implementation of a device under test that is suitable for use with the automatic test system of FIG. 1.

A block diagram of one implementation of the DUT 114 is shown in FIG. 2. The DUT 114 includes internal programmable registers 210a–210b for storing control values. Specifically, in this example, the internal registers 210a–210b are configured to store a ΔD control value and a Δφ control value. These control values, which are provided to control logic circuits 220 (e.g., phase locked loop circuits, delay locked loop circuits, etc.) of the DUT 114, calibrate the duty ratio and phase delay of the input and output signals. These control values can be written directly into the registers 210 by the test probes of the tester 112. Alternatively, the control values can be scanned into the DUT via a scan-chain. In yet other designs, the control values can be written into the registers 210 by applying predefined combinations and sequences of data signals to the I/O pins of the DUT 114. Note that the present embodiment is not limited to DUTs that have two registers for controlling two of their programmable parameters. Rather, it is intended that the scope of the present invention encompasses embodiments suitable for DUTs having an arbitrary number (including 1) of registers or circuits for controlling an arbitrary number (including 1) of programmable parameters.

In the context of the present discussion, a "test pattern" refers to values stored in the test pattern memory for use by an ATE system to test an integrated circuit device. A test pattern is typically represented in a two-dimensional array of logical symbols. Each column of the array typically represents a device pin to which stimulus is applied or to which the device's output data is compared, and each row of the array typically represents an incremental time interval. A row of the array is typically referred to herein as a "test vector." It should also be noted that the boundary of a test pattern may be user-defined and arbitrary. In some instances, a test pattern may refer to consecutive rows of test vectors. In other instances, a test pattern may be made up of test vectors or portions of test vectors stored in dispersed storage locations of an array.

Sometimes, however, some columns of the array may not correspond to any pin of the DUT, and some columns may correspond to more than one pins of the DUT. An example of such test patterns is shown in FIG. 11. In this example, SIG1 and TRIG are columns of the array that do not correspond to any pins of the DUT. SIG1 may be used to address internal tester resources. For example, SIG1 may be used to address a Fail Capture Memory of the tester, and TRIG may be routed to an interface that connects to an oscilloscope and may be used to trigger the oscilloscope into a capture mode. Also note the Vector Number column and the Command column. Typical test patterns have simple increment or repeat command. In the case of repeat command, a test vector is repeated an indicated number of times. Note that such commands will cause a divergence between the vector number and the cycle number. For example, the test vector "000003" is executed at cycle number "13" because vector "000002" is repeated ten times. The test vector number and/or the cycle number can be captured by the present invention.

With reference still to FIG. 1, test patterns are stored with test pattern memory 122 used by the Stimulus Pattern Generation Logic 126 of the tester 112 to generate "stimulus vectors" for application to the DUT 114. In the present discussion, "stimulus vectors" may be in the form of ones, zeros or other logical representations of the stimuli. In some instances, the test vectors are identical to the stimulus vectors. In general, however, test vectors may not be identical to the stimulus vectors. For example, control data for triggering an external oscilloscope is present in the test vectors but is not present in the stimulus vectors. In another example, the test patterns in the test pattern memory 122 may be transformed by the Stimulus Pattern Generation Logic 126 to produce the stimulus vectors. To illustrate some possible transformations, assume the value of N bits of data in a test vector is X, and assume that the value of M bits of data in the same test vector is Y. Some possible transformations that can be performed on the test pattern data to produce stimulus vectors can be:

f(X)=!X (complement of X);
f(Y)=!Y (complement of Y);
f(X,Y)=X*Y(X and Y);
f(X,Y)=X+Y(X or Y);
f(X,Y)=X^Y(X xorY).

With reference again to FIG. 1, the control system 110 provides test patterns to the tester 112 during a set-up phase of a sweep test. As mentioned, the term "sweep test" refers to a procedure where a DUT is tested under various test conditions, and the term "sweep points" refers to the various test conditions at which the DUT is tested. Sweep tests are sometimes called "search tests." Another form of sweep test is called "shmoo." Each sweep point is typically defined by one or more variable "sweep values," and each sweep test generally has many sweep points. In one embodiment, each test pattern has control data for adjusting the internal registers of the DUT 114 and test data for testing functions or logic of the circuit device at one or more sweep points. In another embodiment, each test pattern has control data and test data for performing one or more functional or logical tests on the circuit device across multiple sweep points. The test patterns may be stored in a test pattern memory 122.

During a sweep test, stimulus-generation hardware 126 of the tester 112 retrieves the test pattern from the test pattern memory 122, generates stimulus vectors accordingly, and applies the stimulus vectors to the DUT 114. Portions of the stimulus vectors corresponding to control data store the specified control values within the internal registers of the DUT 114, thereby altering the programmable parameters of the DUT 114 and setting up the DUT 114 for different sweep points. Portions of the stimulus vectors corresponding to the functional test data cause the DUT 114 to generate output responses, which can be captured by the tester 112 for analysis.

With reference still to FIG. 1, the tester 112 sequentially applies test vectors associated with multiple test points from test pattern 112 without interruption. In other words, the tester 112 executes a series of test patterns without interruption This is referred to herein as burst mode operation. In other embodiments, the tester 112 may operate in different modes, such as loop back mode or algorithm mode. In the loop back mode, the tester 112 may repeat portion(s) of the test pattern. In the algorithm mode, the tester 112 may repeat portion(s) of the test pattern in response to the outputs of the DUT 114. In the present embodiment, because the tester 112 stores a test pattern that encompasses many sweep points in its test pattern memory 122, the tester 112 can perform multiple functional or logical tests at multiple sweep points without control system intervention.

According to one embodiment of the present invention, adjusting one or more internal registers of the DUT 114 is functionally equivalent to adjusting one or more test hardware resources in the tester 112, in that an equivalent test is performed on the DUT, but the programming of the internal registers is typically accomplished in significantly less time that would be required to reprogram the tester hardware resources. For example, instead of adjusting the phase of a signal sent by the tester to the DUT 114, a signal delay control register in the DUT 114 may be programmed to accomplish the same result. In a second example, instead of adjusting a signal voltage level in the tester, a voltage offset register in the DUT 114 may be programmed to accomplish the same result. Writing such values into a control register of the DUT 114 will generally be accomplished by sending to the DUT a small number of rows of the test pattern stored in the test pattern memory 122, typically requiring significantly less than a microsecond to complete. But it may take up to 100 ms or more to reprogram the tester hardware resources. As a result, writing values to multiple registers in the DUT 114 will typically be completed in less than one percent of the time that would be required to reprogram the corresponding tester hardware resources.

Figure 3:
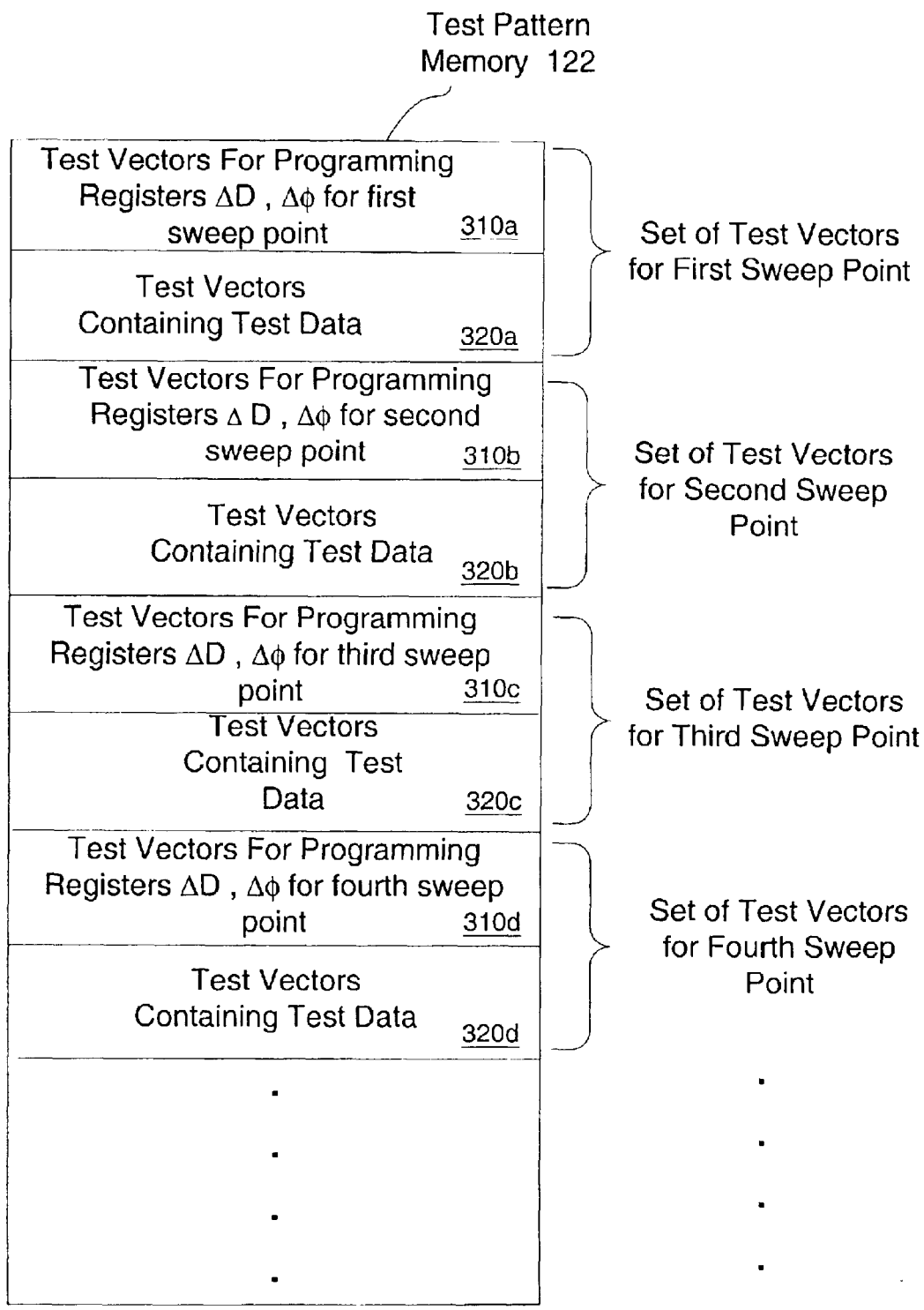
FIG. 3 is a block diagram illustrating test patterns that are sent by the host control system to the tester of FIG. 1.

FIG. 3 is a block diagram of a test pattern list that is stored within the test pattern memory 122 of the tester 112. Note that the test pattern list is a concatenation of multiple test patterns for testing multiple sweep points. Also note that each of the illustrated test patterns has a Register-Programming portion 310 and a Test Data portion 320 each of which includes one or more test vectors. For instance, the Register-Programming portion 310a contains test vectors for programming the internal registers 210 of the DUT 114, and the Test Data portion 320a contains data for testing the DUT after the internal registers of the DUT 114 have been programmed.

A few test pattern examples are described below with reference to FIG. 11, which depicts a portion of a test pattern according to an embodiment of the present invention. In a first example, assume that column IN4 controls a register access mode of the DUT and column IN0 produces a clock signal for the DUT. Further assume that column IN2 defines the serial data input to one of the DUT's internal programmable registers. In this example, a 4-bit long binary control value "0011" is programmed serially through IN2 into the DUT when vector lines 000004 through 000011 cause the DUT's internal register to clock in "0011" on every rising edge of the clock when the register access mode (IN4) is asserted.

In a second example, assume that IN4 controls the register access mode of the DUT and IN0 produces a clock signal for the DUT. Further assume that column IN3 is the register load signal, and IN2–IN1 are parallel inputs to the internal register of the DUT. In this example, the binary value of "0011" will be loaded into the DUT's internal register at vector line number 000005.

In a third example, assume that IN0 is a clock signal for the DUT and that IN4 controls the register access mode. Further assume that the tester actively drives zeros and ones into the DUT or provides high or low (H/L) values for comparing to the outputs of the DUT. Vector lines 000100 to 009999 therefore contain the test data used for the purpose of the sweep test. Vector lines 000000 to 009999 constitute one set of test vectors for one sweep point. When multiple sets of test vectors like vector lines 000100 to 009999 are stored in the test pattern memory 122, multiple sweep points can be tested without control system intervention in between sweep points.

In one particular embodiment of the invention, the circuit device testing system is suitable for testing memory devices that have the capability to alter their operational parameters when properly programmed. An example of such a memory device is a RAMBUS® RDRAM memory device. In this embodiment, for example, each set of test vectors includes a Register-Programming portion for programming the internal registers of the memory devices. Further, a test data portion of each set of test vectors contains read/write commands as well as data to be written to the memory devices. The test data portion may also be used by the tester in verifying the read/write operations of the memory device under test. In memory testing, the stimuli that are written to the DUT for each sweep point may be identical or may vary from one sweep point to the next. In testing other types of logic circuits, for example ASICs, the stimuli applied to the DUT for each sweep point is usually identical except for variations in the selected operational parameters that define the sweep point.

As mentioned, the tester 112 can execute functional and/or logical tests at multiple sweep points without control system intervention. That is, the control system 110 does not need to reprogram the tester 112 at every sweep point. A significant time saving is achieved because control system intervention, which can be very slow in comparison to the data rate of the tester, is reduced. For example, the tester needs only 1.25 ms to apply a 1 Mbit stimulus at a data burst rate of 800 Mbps. The control system 110 may take up to 100 ms or longer to reprogram the tester for another sweep point. In the case of a linear sweep with 100 sweep points in the sweep range, sweep execution time will be 10.125 seconds if the control system intervenes at every one of the sweep point. If the control system does not intervene, the sweep execution time for the same sweep test will be merely 0.125 second. Thus, the present invention, which reduces and in some cases eliminates reprogramming of the tester hardware by the control system at every sweep point, avoids this problem and significantly reduces characterization time.

Figure 6:
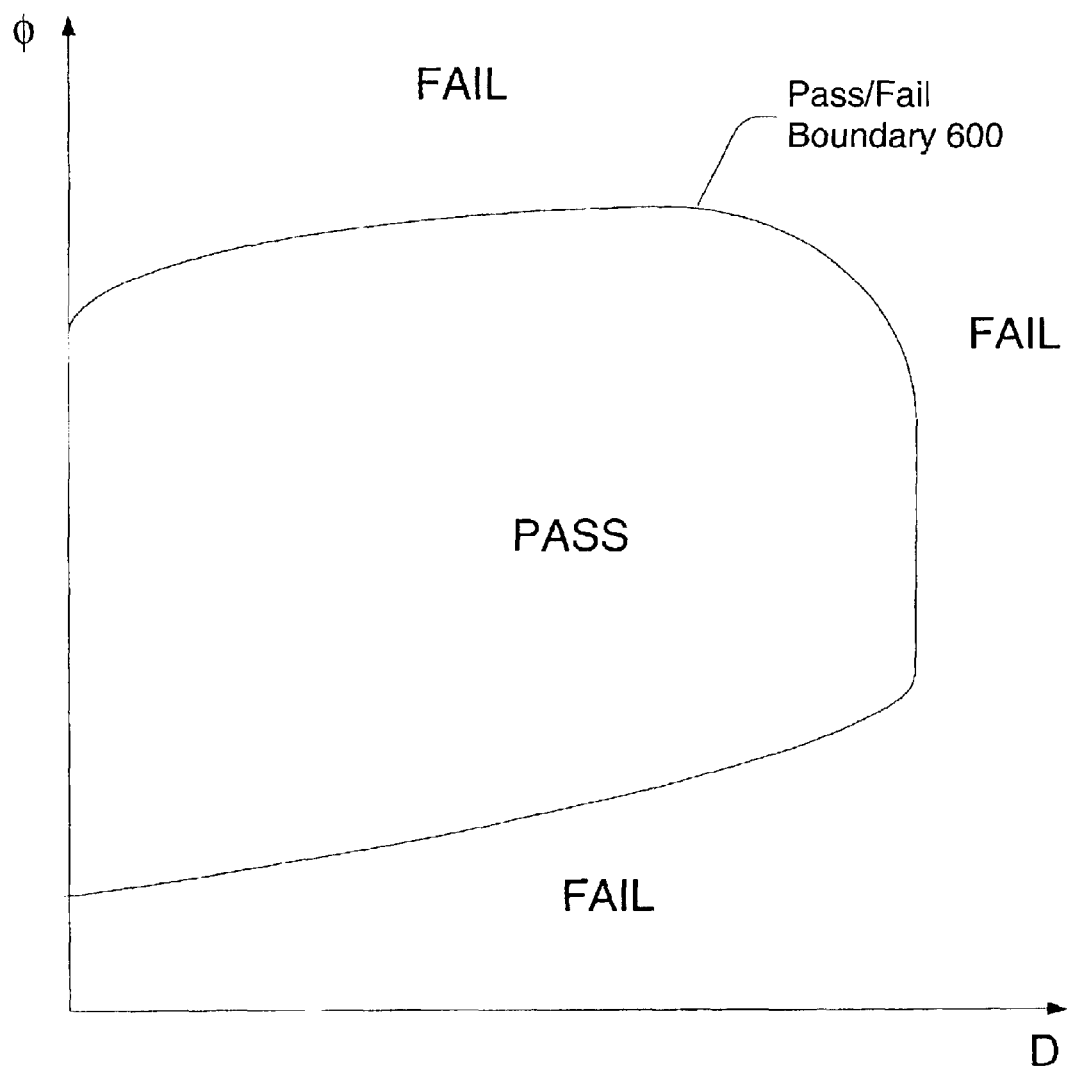
FIG. 6 is a "shmoo" diagram showing a Pass/Fail Boundary of a DUT that can be derived from the Block Pass/Fail Indicators stored in the FCM of FIG. 5.

With reference again to FIG. 1, the stimulated responses generated by the DUT 114 are processed by a Pass/Fail Indicator Generation Logic 124 to generate Pass/Fail Indicators. In one embodiment, at each sweep point, multiple functional tests and/or logical tests are performed on the DUT 114 under the same test condition, yielding multiple Pass/Fail results. A Pass/Fail Indicator, indicates a "Failure" if any one or more of the tests performed at a sweep point generates a "Fail" result; and, it indicates a "Pass" if all of the tests performed at the sweep point generate a "Pass" result. In other words, each Pass/Fail Indicator summarizes at least part of the Pass/Fail results pertaining to one particular sweep point. In the present embodiment, the Pass/Fail Indicators are stored in a Fail Capture Memory 128, the contents of which may be read out by the control system 110. Using the Pass/Fail Indicators and appropriate software, the control system 110 can delineate a Pass/Fail Boundary for the DUT 114. A "shmoo" diagram showing a Pass/Fail Boundary 600 that can be derived from the Pass/Fail Indicators collected after a sweep test is depicted in FIG. 6. In other embodiments, more than one Pass/Fail Indicator may be used to represent the Pass/Fail results at a sweep point.

Figure 4:
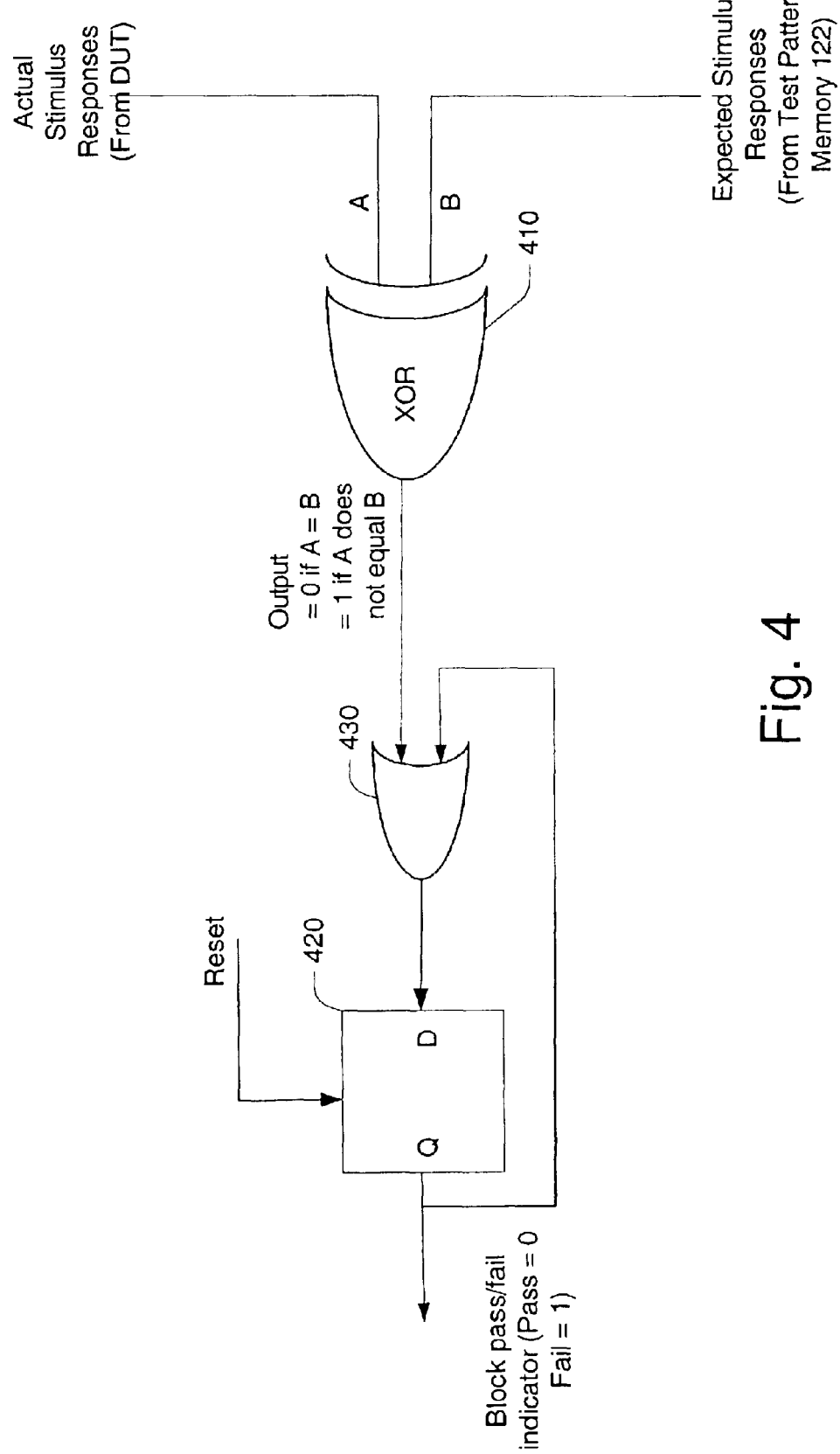
FIG. 4 shows a portion of one example implementation of the Block Pass/Fail Indicator Generation Logic of the tester of FIG. 1.

FIG. 4 shows a portion of one example implementation of the Pass/Fail Indicator Generation Logic 124 of the tester 112. As illustrated, the Generation Logic 124 includes a comparator 410 for comparing the output from the DUT 114 to an expected value (which can be a test vector, a value derived from the test pattern, etc.). For example, if the device under test is a memory device, data written to the memory device is compared to data read from the device to see if there is an exact match. In the example implementation shown in FIG. 4, if the actual output, A, matches the expected output, B, then the output of the comparator 410 will be "0," or "Pass." If A does not match B, however, the output of the comparator 410 will be "1," or "Fail." The output of the comparator 410 is coupled to an input of an OR gate 430. The output of the OR gate 430 is coupled to the input of a D-flip flop 420. Another input of the OR gate 430 is coupled to the output of the D-flip flop 420. In this example implementation, the output of the D-flip flop 420 will be "0," or "Pass," if the current and previous tests at the same sweep point generate a "Pass" result. The output of the OR gate 430, however, will be "1," or "Fail," if any one of the current and previous tests at the same sweep point generates a "Fail" result. Note that, in this embodiment, the D-flip flop 420 is reset for every set of test vectors such that one Pass/Fail Indicator represents the test results at one sweep point. In other embodiments, the D-flip flop can be reset multiple times per sweep point, or once per multiple sweep points.

Figure 5:
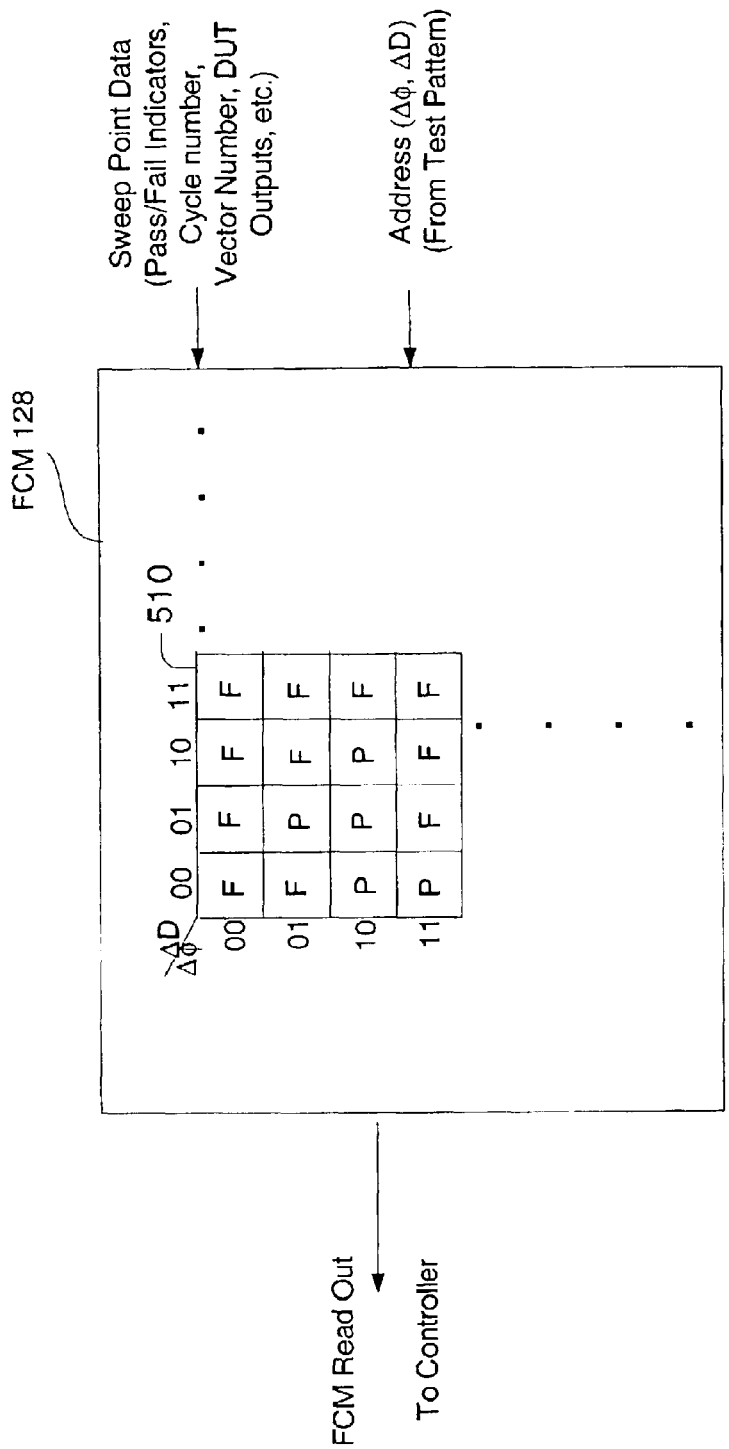
FIG. 5 shows a block diagram of a Fail Capture Memory (FCM) for storing the Block Pass/Fail Indicators in accordance with an embodiment of the present invention.

In one embodiment, the comparator 410 is implemented by N number of X-OR gates, where N is equal to the number of DUT signals selected for comparison. The outputs of the X-OR gates are "OR"ed together to indicate a fail result. Referring now to FIG. 5, there is shown a block diagram of a Fail Capture Memory (FCM) 128 for storing the Block Pass/Fail Indicators in accordance with an embodiment of the present invention. The FCM 128 includes a matrix of memory cells 510 arranged in rows and columns that are addressed by values corresponding to the programmable parameters used at each sweep point. In the example shown in FIG. 5, the Pass/Fail Indicator obtained at a particular sweep point is stored in the FCM 128 using values corresponding to $\Delta D$ and $\Delta \phi$ as column and row addresses. Other values that can be derived from the test pattern (e.g., cycle number, vector number) can also be used as row and column addresses. Additional information, such as the control values, and or other values that can be derived from the test pattern and/or outputs of the DUT 114 can also be stored in the FCM 128.

Also shown in FIG. 5 is an FCM output that is coupled to the control system 110 to give the control system 110 access to the Pass/Fail Indicators. In one embodiment, the control system 110 accesses the FCM 128 after a sweep test is completed. In other embodiments, the control system 110 accesses one address of the FCM 128 while the tester 112 is writing a Pass/Fail Indicator into another address. Note that, in other embodiments, the number of values used to address the FCM corresponds to the number of programmable parameters used to define a sweep point. For example, in cases where three programmable parameters define a sweep point, one programmable parameter can be used as column address, while the other two programmable parameters can be used together as row address. That is, in this example, the address dimensions space of the FCM is partitioned in two to match the number of parameters swept. However, the address space can be partitioned in any number of axes for any number of parameters.

Figure 7A:
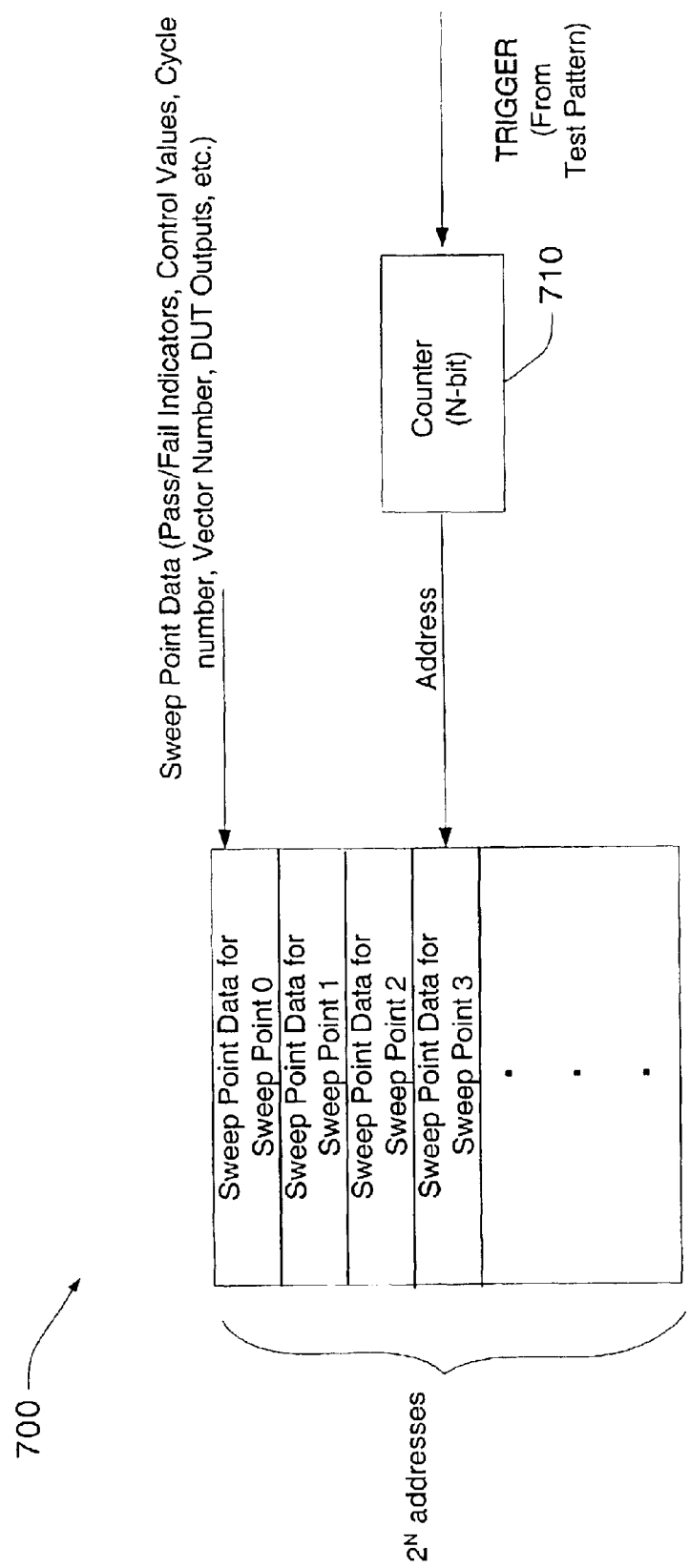
FIG. 7A depicts a Fail Capture Memory according to another embodiment of the present invention.

FIG. 7A depicts a block diagram of a Fail Capture Memory 700 according to another embodiment of the present invention. The FCM 700 is a memory that is addressed by an N-bit counter 710, which increments upon receiving the TRIGGER signal from the logic of the tester. In this embodiment, the tester generates the TRIGGER signal for every set of test vectors. In this way, each address of the FCM 700 will store sweep point data (e.g., Pass/Fail Indicator, control values, cycle number, vector number) associated with a particular sweep point at each memory location. Additional information, for example values that can be derived from the test pattern and/or outputs of the DUT, can also be stored at each memory location of the FCM 700.

Figure 7B:
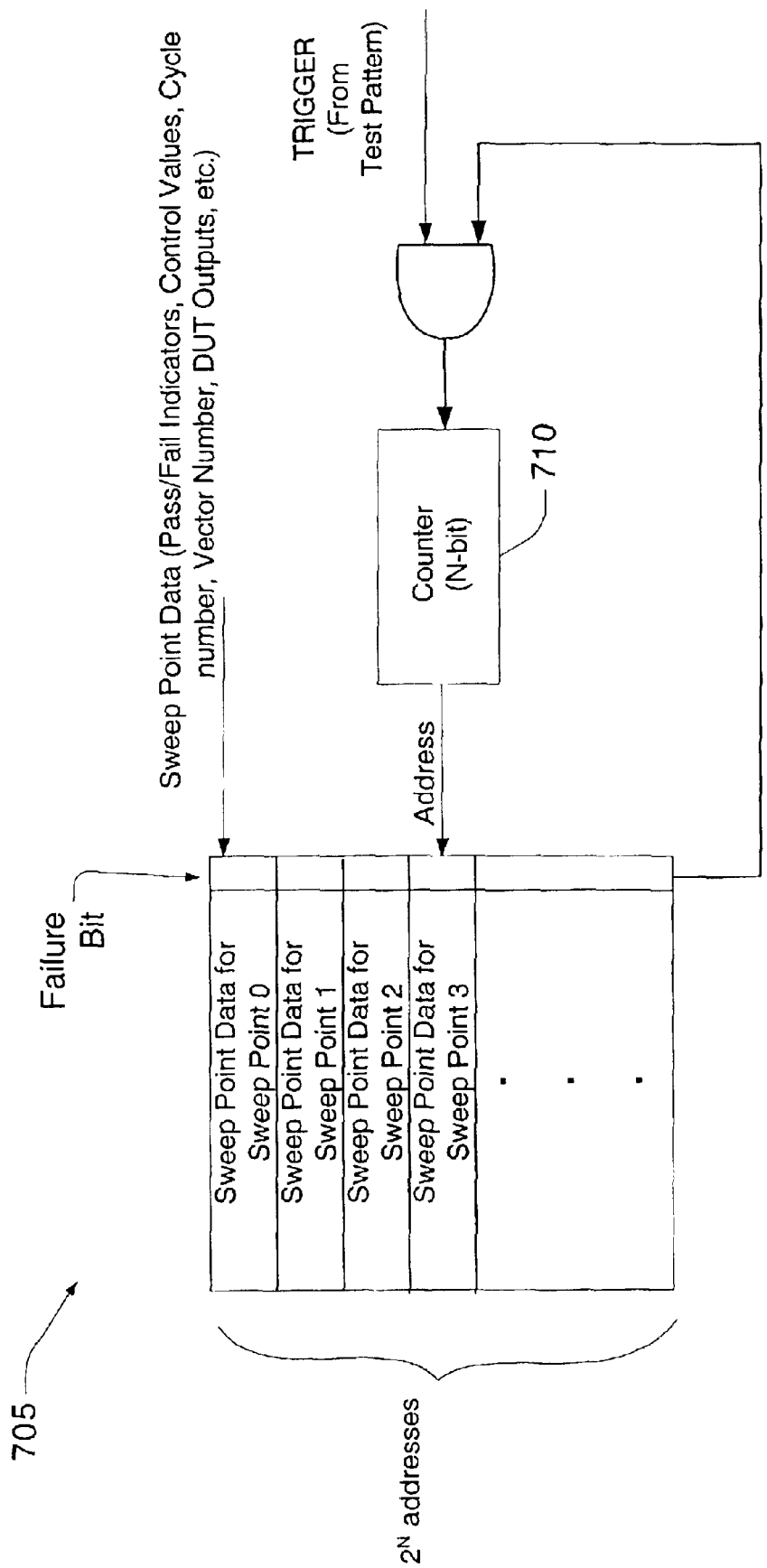
FIG. 7B depicts a Fail Capture Memory according to yet another embodiment of the present invention.

FIG. 7B depicts a block design of a Fail Capture Memory 705 according to another embodiment of the invention. Data stored in FCM 705 includes a Failure Bit, which indicates that the data stored is "Failure Data" when set. "Failure Data" herein refers to data associated with a sweep point at which the DUT failed. When data associated with a sweep point at which the DUT did not fail is written to the FCM 705, it will be overwritten by data of a subsequent sweep point. This is because the address counter 710 is incremented upon receiving a TRIGGER signal only if the current memory location contains "Failure Data." In this way, only "Failure Data" is captured by the FCM 705, thus allowing a small memory to be used for capturing sweep data. In this embodiment, the capture data preferably includes the vector numbers and/or cycle numbers at which the DUT failed.

Figure 8:
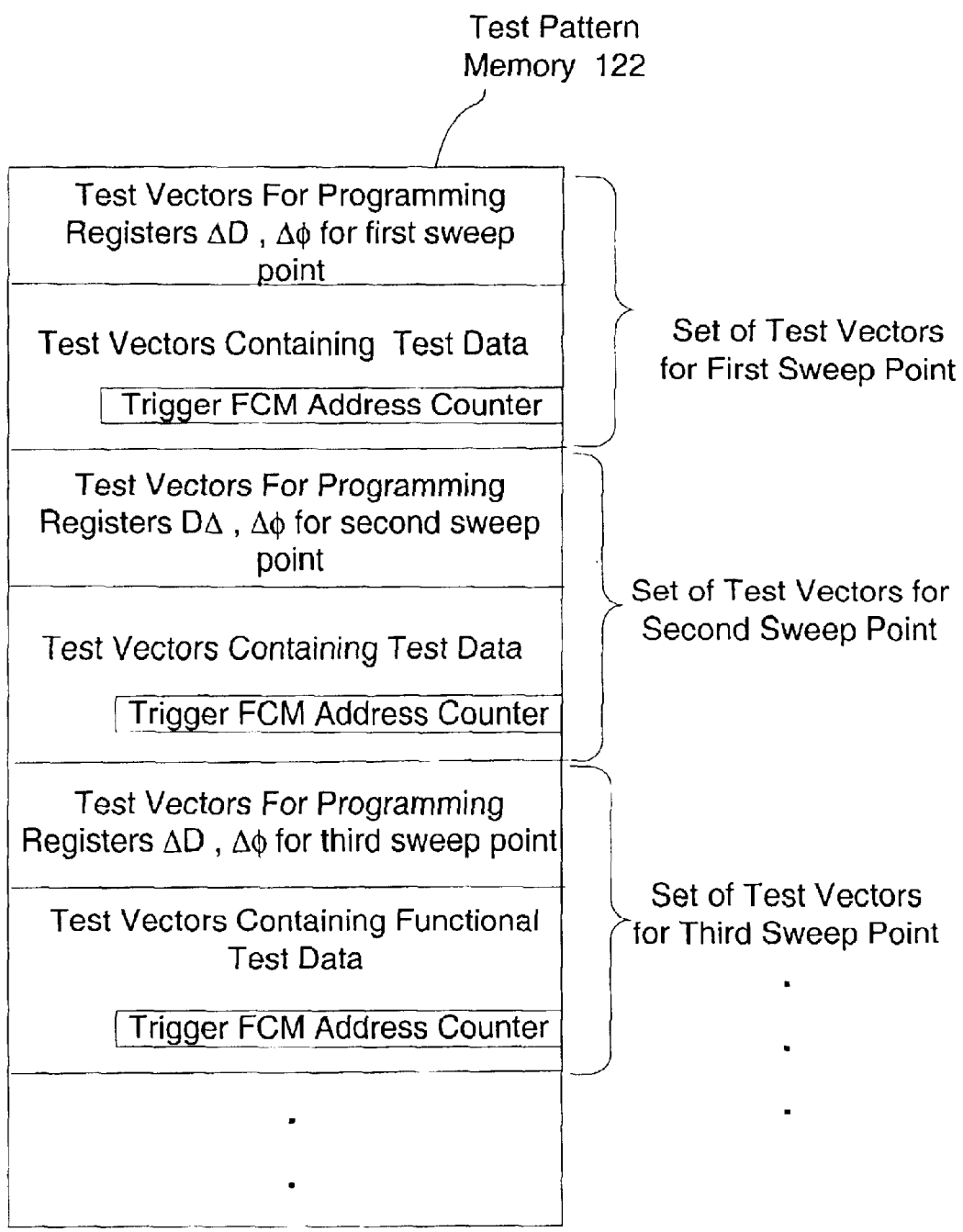
FIG. 8 depicts part of a test pattern that can be used in conjunction with the FCM's of FIG. 7A or FIG. 7B, in accordance with one embodiment of the present invention.

FIG. 8 depicts test patterns that can be used in conjunction with FCM 700 of FIG. 7. As shown, each test pattern in FIG. 8 includes vectors for programming the internal registers of the DUT, vectors containing functional test data, and special test vectors for causing the tester to generate the TRIGGER signal. Note that, in this embodiment, the control system provides the entire test pattern list to the tester during the test set-up phase. Thus, control system intervention is not required in between sweep points. As a result, significant time savings can be achieved. In this embodiment, the tester includes hardware resources or control logic for generating TRIGGER signals upon encountering such special test vectors.

Figure 9:
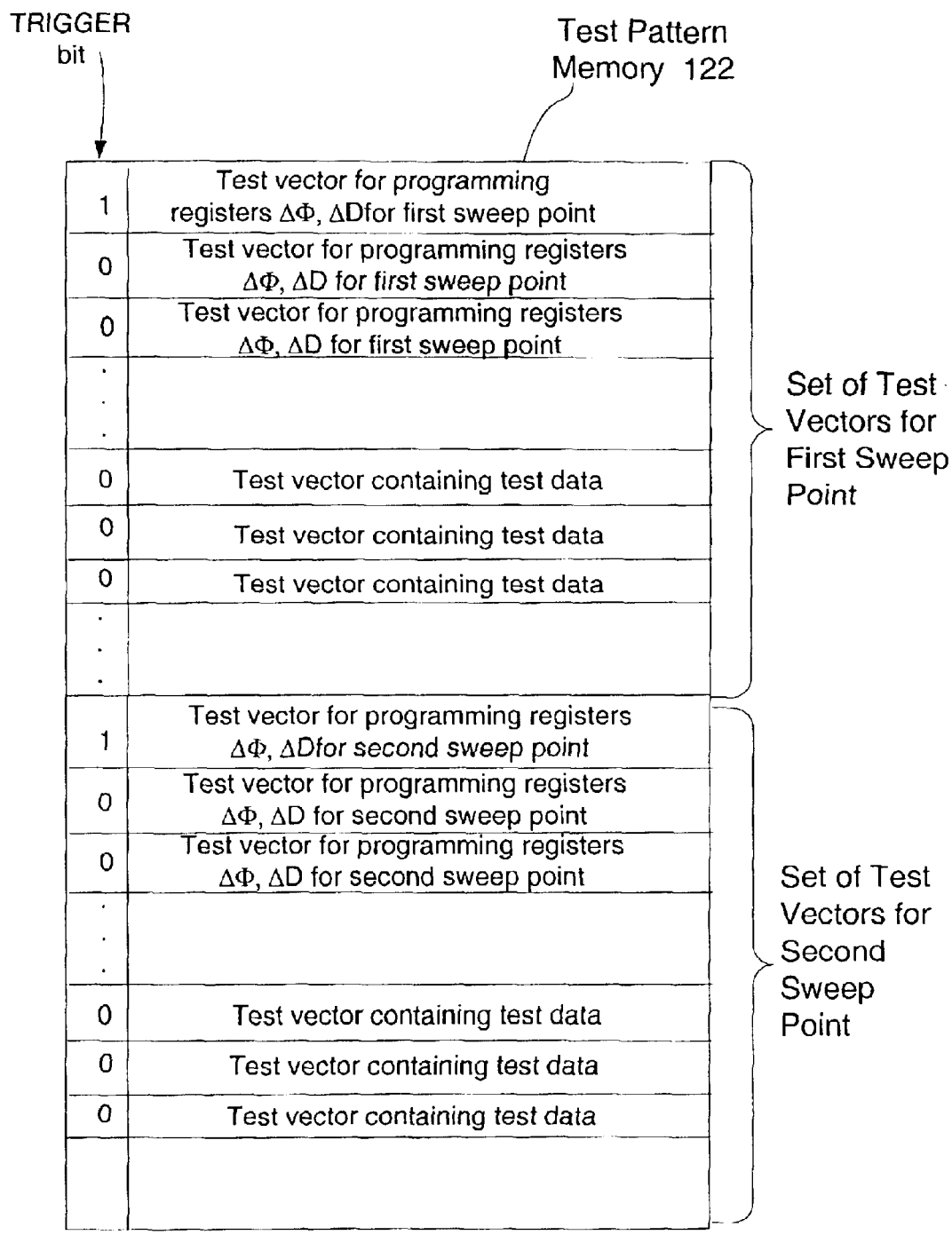
FIG. 9 depicts part of a test pattern that can be used in conjunction with the FCM's of FIG. 7A or FIG. 7B, in accordance with yet another embodiment of the present invention.

FIG. 9 depicts a test pattern that can be used in conjunction with FCM 700 of FIG. 7, in accordance with yet another embodiment of the present invention. As shown, each set of test vectors in FIG. 8 includes vectors for programming the internal registers of the DUT and vectors containing test data. Further, each test pattern has a TRIGGER bit. However, only one TRIGGER bit is set for each set of test vectors. The TRIGGER bit, when set, causes control logic of tester to generate a TRIGGER signal. The counter 710 upon receiving the TRIGGER signal, increments the address pointer to point to a memory location at which the current Pass/Fail Indicator will be stored.

Figure 12:
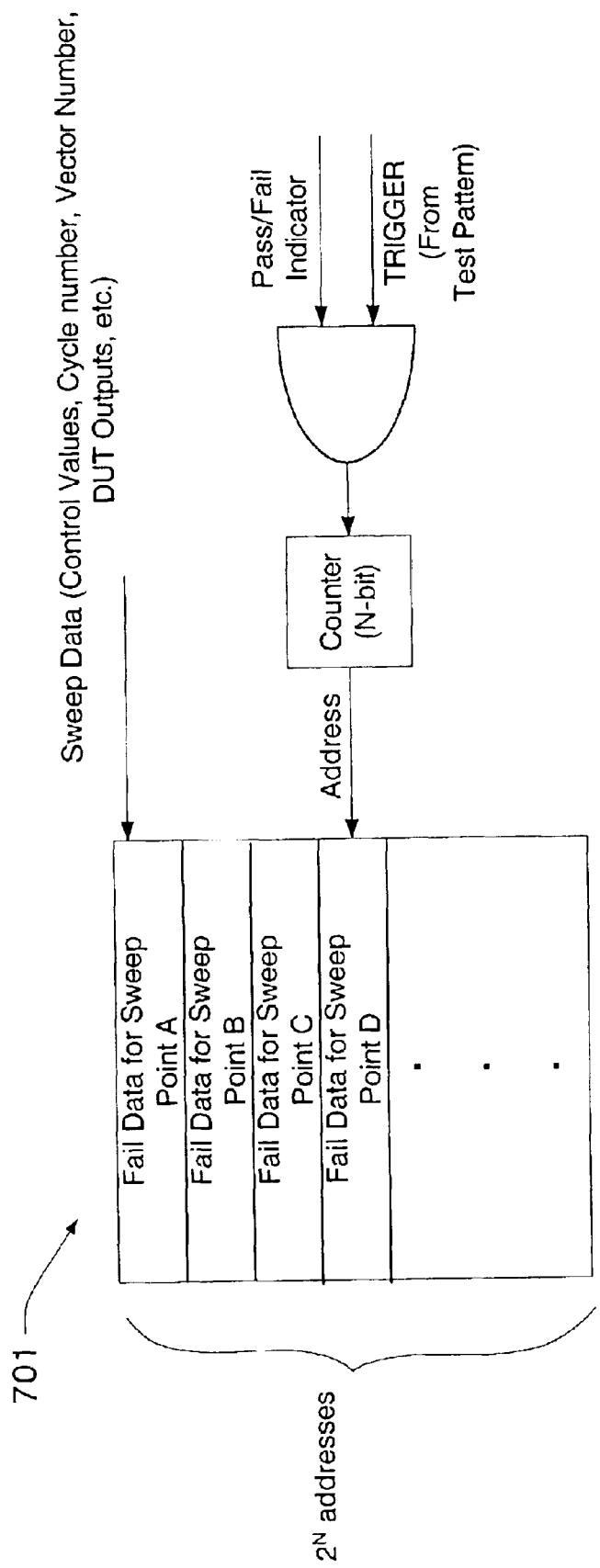
FIG. 12 depicts a Fail Capture Memory according to another embodiment of the present invention.

FIG. 12 depicts a block diagram of a Fail Capture Memory 701 according to another embodiment of the present invention. The FCM 701 is addressed by an N-bit counter 710, which receives a Pass/Fail Indicator from Pass/Fail Indicator Generation Logic 124 and a TRIGGER signal derived from the test pattern. The counter 710 increments only when a "fail" result is detected. Thus, each memory location of the FCM 701 will store only data associated with sweep points at which failures occur. For example, the memory locations of FCM 701 will store the vector numbers and/or cycle numbers associated with the sweep points at which the DUT failed. Address-based FCM's are typically small. Therefore, when there can be many failures within a sweep point, this fail data compression ensures running of the sweep test in a single pass.

Note that, in some embodiments, the Fail Capture Memory of the tester stores Pass/Fail Cycle Information in addition to the Pass/Fail Indicators. Examples of Pass/Fail Cycle Information includes, and are not limited to, the control values used, the locations or cycle number where failures occur, etc.

Figure 10:
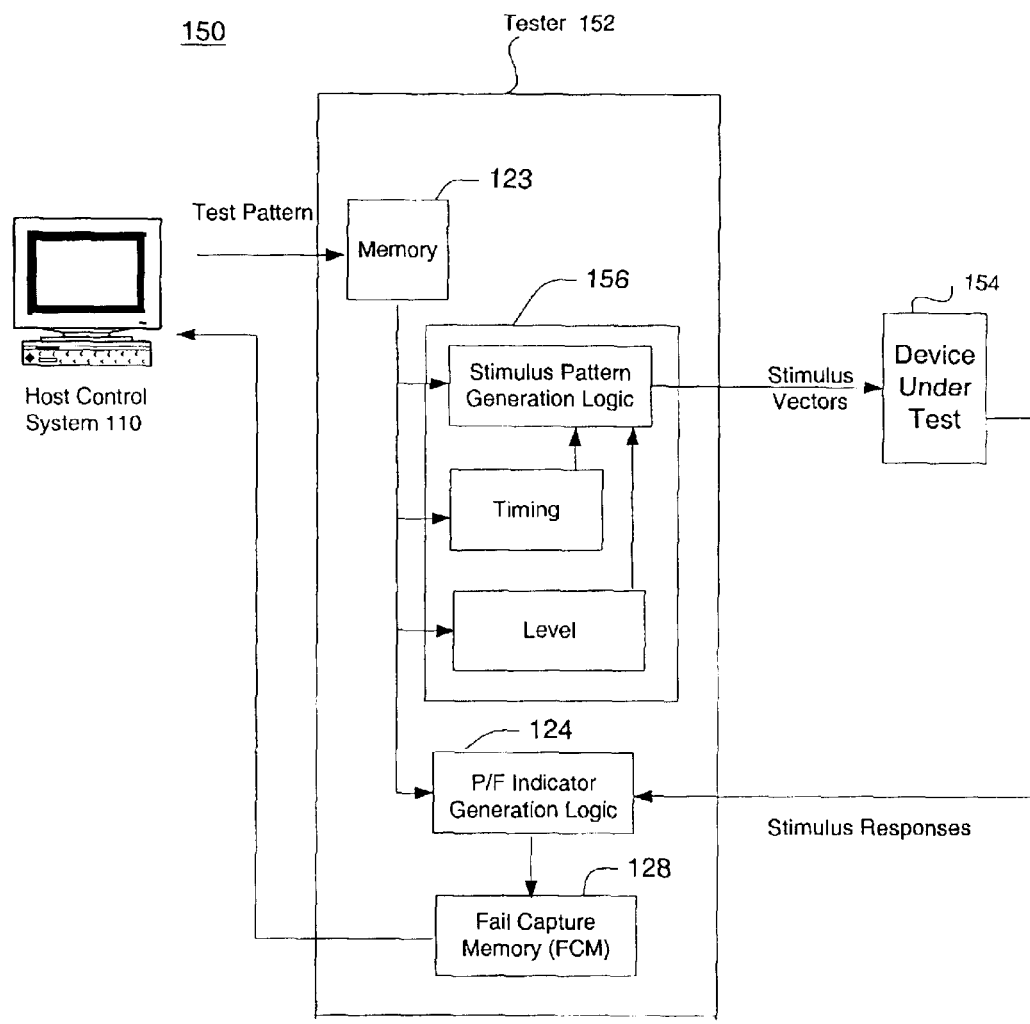
FIG. 10 depicts a circuit device testing system according to another embodiment of the present invention.

With reference now to FIG. 10, there is shown a circuit device testing system 150 according to another embodiment of the present invention. In this embodiment, the system 150 is suitable for testing a circuit device that does not have programmably controllable parameters. Nevertheless, significant time savings can be achieved by this embodiment.

As shown in FIG. 10, the testing system 150 includes a control system 110 and a tester 152. Also shown is a circuit device under test (DUT) 154. A robotic handling system, which may be controlled by the control system 110, positions the DUT 154 to make contact with numerous test probes on the tester 152. The control system 110 provides a test pattern having both control data for controlling the hardware resources of the tester 152 and functional test data, to the tester 152 during a set-up phase of the test. The test pattern, which includes multiple sets of test vectors for multiple sweep points, is stored within a test pattern memory 123.

During operation, stimulus-generation hardware 156, including, for example, timing and level hardware of the tester 152 retrieves the test pattern from the test pattern memory 123. The hardware resources of the tester 152 then generate stimulus vectors according to the functional test data and the control data. In one aspect, this embodiment of the invention can be described as using the multiple sets of test vectors to program and reprogram the hardware sources of the tester 152 "on the fly" at different sweep points. The stimulation responses of the DUT 154 are captured and processed by the tester 152. Pass/Fail Indicators can be generated in a manner similar to that of tester 112.

Like tester 112, the tester 152 does not require the control system 110 to intervene at every sweep point. Using the test pattern data to program the hardware resources of the tester 152 "on the fly" requires less time than that would be required for control system intervention. For example, instead of the control system 110 intervening at every sweep point to reprogram the tester hardware resources, the test pattern itself provides the necessary control data for reprogramming the tester hardware resources for different sweep points to accomplish the same result. In this way, when the control system does not intervene at every sweep point, significant time-savings can be achieved.

According to the embodiment shown in FIG. 10, results of the sweep test are stored in the FCM 128. Logic circuits for generating Pass/Fail Indicators similar to those described above are used in the tester 152. In one embodiment, the Pass/Fail Indicators stored in the FCM 128 where values corresponding to the control data are used as row and column addresses. In another embodiment, the Pass/Fail Indicators are stored in the FCM 128 where one or more memory locations correspond to a sweep point. In yet another embodiment, only indicators representing failure results are stored in the FCM 128 where one or more memory locations correspond to a sweep point.

While the present invention has been described with reference to a few specific embodiments, the description is illustrative of the invention and is not to be construed as limiting the invention. Various modifications may occur to those skilled in the art having the benefit of this disclosure without departing from the inventive concepts described herein.

What is claimed is:

1. A method of testing a circuit device, comprising:
   storing test patterns in a tester, the test patterns having control data that defines at least in part a plurality of control values to be stored at one or more internal registers of the circuit device, the plurality of control values including at least one control value to adjust at least one analog operational parameter of the circuit device, the plurality of control values defining at least in part a plurality of test conditions for testing the circuit device;
   stimulating the circuit device according to the test patterns;
   generating a plurality of test results associated with the test conditions;
   storing the test results in the tester; and
   determining a pass/fail boundary of the circuit device based at least in part on one of the plurality of test results.

2. The method of claim 1, wherein the storing step comprises storing the test results in association with information representative of the plurality of test conditions in the tester.

3. The method of claim 1, wherein the storing step comprises writing a first one of the test results at a first memory location of the tester.

4. The method of claim 3, wherein the first memory location is defined at least in part by a first one of the control values.

5. The method of claim 4, wherein the storing step comprises writing a second one of the test results at a second memory location of the tester.

6. The method of claim 5, wherein the second memory location is defined at least in part by a second one of the control values.

7. The method of claim 1, wherein the storing step comprises writing a first one of the test results at a first memory location of the tester.

8. The method of claim 7, wherein the first memory location is defined at least in part by an address pointer.

9. The method of claim 8 wherein the storing step comprises changing the address pointer.

10. The method of claim 9, wherein the storing step comprises writing a second one of the test results at a second memory location of the tester.

11. The method of claim 10, wherein the second memory location is defined at least in part by the changed address pointer.

12. The method of claim 7, wherein the first one of the test results indicates that the circuit device failed at least one test performed under a first one of the test conditions.

13. The method of claim 12, wherein the second one of the test results indicates that the circuit device failed at least one test performed under a second one of the test conditions.

14. The method of claim 1, wherein the at least one analog operational parameter comprises a timing parameter of the circuit device.

15. A method of testing a circuit device, comprising:
applying stimulus vectors to the circuit device, at least a portion of the stimulus vectors causing a control value to be stored in an internal register of the circuit device, the control value to adjust at least one analog operational parameter of the circuit device;
storing a test result generated at least in part from outputs of the circuit device in response to at least one of the stimulus vectors at a memory location whose address corresponds to the control value; and
determining a pass/fail boundary of the circuit device based at least in part on the test result.

16. The method of claim 15, wherein the control value defines at least in part a test condition under which the circuit device receives the at least one stimulus vector.

17. The method of claim 15, wherein the control value defines at least in part a test condition under which the circuit device produces outputs.

18. The method of claim 15, further comprising storing a test pattern in a test pattern memory.

19. The method of claim 18, further comprising generating the stimulus vectors according to the test pattern.

20. The method of claim 19, wherein the test pattern includes test data and control data.

21. The method of claim 20, wherein the control data specifies a plurality of control values.

22. The method of claim 15, wherein the at least one analog operational parameter comprises a timing parameter of the circuit device.

23. A method of testing a circuit device having an internal register for controlling an operational parameter of the circuit device, the method comprising:
transferring, from a control system to a tester a plurality of sets of test vectors, at least one set of the plurality of sets of test vectors including test data and control data that specifies a control value to be stored at the internal register of the circuit device, the control value to adjust at least one analog operational parameter of the circuit device;
generating stimulus vectors based on the test vectors, a first portion of the stimulus vectors corresponding to the control data and a second portion of the stimulus vectors corresponding to the test data; and
applying the stimulus vectors to the circuit device, the first portion of the stimulus vectors storing the control value in the internal register of the device so as to cause the circuit device to receive the second portion of the stimulus vectors under a test condition that is at least partially defined by the control value;
generating a test result from outputs of the circuit device;
storing the test result in the tester at a memory location that is defined at least in part by the control value; and
determining a pass/fail boundary of the circuit device based at least in part on the stored test result and the control value.

24. The method of claim 23, wherein the applying step comprises applying the stimulus vectors corresponding to more than one set of test vectors to the circuit device without intervention by the control system.

25. The method of claim 23, wherein the at least one analog operational parameter comprises a timing parameter of the circuit device.

26. A method of testing a circuit device having an internal register for controlling an operational parameter of the circuit device, the method comprising:
transferring, from a control system to a tester, a plurality of sets of test vectors, at least one set of the plurality of sets of test vectors including test data and control data that specifies a control value to be stored at the internal register of the circuit device to adjust at least one analog operational parameter of the circuit device;
generating stimulus vectors based on the test vectors, a first portion of the stimulus vectors corresponding to the control data, a second portion of the stimulus vectors corresponding to the test data, a third portion of the stimulus vectors for changing an address pointer for one or more sets of the test vectors; and
applying the stimulus vectors to the circuit device, the first portion of the stimulus vectors storing the control value in the internal register of the device so as to cause the circuit device to receive the second portion of the stimulus vectors under a test condition that is at least partially defined by the control value;
generating a test result from outputs of the circuit device;
storing the test result in the tester at a memory location that is defined at least in part by the address pointer; and
determining a pass/fail boundary of the circuit device based at least in part on the stored test result and the address pointer.

27. The method of claim 26, wherein the applying step comprises applying the stimulus vectors corresponding to more than one sets of the test vectors to the circuit device without intervention by the control system.

28. The method of claim 26, wherein the at least one analog operational parameter comprises a timing parameter of the circuit device.

29. A method of testing a circuit device having an internal register for controlling an operational parameter of the circuit device, the method comprising:
transferring, from a control system to a tester, a plurality of sets of test vectors, at least one set of the plurality of sets of test vectors including test data and control data that specifies a control value to be stored at the internal register of the circuit device, the control value to adjust at least one analog operational parameter of the circuit device;

generating stimulus vectors based on the test vectors, a first portion of the stimulus vectors corresponding to the control data and a second portion of the stimulus vectors corresponding to the test data; and applying the stimulus vectors to the circuit device, the first portion of the stimulus vectors storing the control value in the internal register of the device so as to cause the circuit device to receive the second portion of the stimulus vectors under a test condition that is at least partially defined by the control value;

generating a test result from outputs of the circuit device; and storing the test result in the tester provided that the test result indicates the circuit device failed under the test condition.

30. The method of claim 29, wherein the storing step comprises writing a failed indicator at a memory location of the tester.

31. The method of claim 30, wherein the memory location is defined at least in part by an address pointer.

32. The method of claim 31, further comprising changing the address pointer only when a failed indicator is generated.

33. The method of claim 29, wherein the applying step comprises applying the stimulus vectors corresponding to more than one set of test vectors to the circuit device without intervention by the control system.

34. The method of claim 29, wherein the at least one analog operational parameter comprises a timing parameter of the circuit device.

35. A method of testing a circuit device, comprising:

stimulating the circuit device according to one or more test patterns, at least one of the test patterns including control data that defines at least in part one or more control values to be stored at one or more internal registers of the circuit device, wherein the one or more control values define at least in part one or more test conditions for testing the circuit device and adjust at least one analog operational parameter of the circuit device;

generating one or more test results associated with the one or more test conditions; and determining a pass/fail boundary of the circuit device based at least in part on the one or more test results and the one or more test conditions.

36. The method of claim 35, further comprising:

transferring, from a control system to a tester a plurality of sets of test vectors, at least one set of the plurality of sets of test vectors including test data and control data that specifies a control value to be stored at the internal register of the circuit device.

37. The method of claim 36, further comprising:

generating stimulus vectors based on the test vectors, a first portion of the stimulus vectors corresponding to the control data and a second portion of the stimulus vectors corresponding to the test data.

38. The method of claim 37, further comprising:

applying the stimulus vectors to the circuit device, the first portion of the stimulus vectors storing the control value in the internal register of the device so as to cause the circuit device to receive the second portion of the stimulus vectors under a test condition that is at least partially defined by the control value.

39. The method of claim 38, further comprising:

storing the test result in the tester at a memory location that is defined at least in part by the control value.

40. The method of claim 35, wherein the at least one analog operational parameter comprises a timing parameter of the circuit device.

41. A system for testing a circuit device, comprising:

stimulus pattern generation logic adapted for coupling with a circuit device and configured to stimulate the circuit device according to one or more test patterns, at least one of the test patterns including control data that defines at least in part one or more control values to be stored at one or more internal registers of the circuit device, wherein the one or more control values define at least in part one or more test conditions for testing the circuit device and adjust at least one analog operational parameter of the circuit device; and pass/fail indicator logic adapted for coupling with the circuit device and configured to generate one or more test results associated with the one or more test conditions based on one or more stimulus responses from the circuit device.

42. The system of claim 41, further comprising:

memory configured for storing the test results in association with information representative of the test conditions.

43. The system of claim 42, wherein the memory includes a matrix of memory cells arranged in rows and columns that are addressable by values corresponding to one or more programmable parameters used for one or more test conditions.

44. The system of claim 41, wherein at least one test result indicates that the circuit device failed at least one test performed under at least one test condition.

45. The system of claim 41, wherein one or more test patterns are part of a sweep test and at least one test condition is a sweep point.

46. The system of claim 41, wherein the control values are used to adjust one or more phase and delay parameters in the circuit device.

47. The system of claim 41, wherein at least one test pattern includes a programming portion for programming an internal register of the circuit device.

48. The system of claim 47, wherein the circuit device is a memory device.

49. The system of claim 41, wherein the at least one analog operational parameter comprises a timing parameter of the circuit device.

50. A computer-readable medium having stored thereon instructions, which, when executed by a processor in a system for testing circuit devices, causes the processor to perform the operations of:

stimulating a circuit device according to one or more test patterns, at least one of the test patterns including control data that defines at least in part one or more control values to be stored at one or more internal registers of the circuit device, wherein the one or more control values define at least in part one or more test conditions for testing the circuit device and adjust at least one analog operational parameter of the circuit device;

generating one or more test results associated with the one or more test conditions; and determining a pass/fail boundary of the circuit device based at least in part on one or more of the test results.

51. A system for testing a circuit device, comprising:

means for stimulating the circuit device according to one or more test patterns, at least one of the test patterns including control data that defines at least in part one or more control values to be stored at one or more internal registers of the circuit device, wherein the one or more control values define at least in part one or more test conditions for testing the circuit device and adjust at least one or more analog operational parameter of the circuit device;

means for generating one or more test results associated with the one or more test conditions; and means for determining a pass/fail boundary of the circuit device based at least in part on one or more of the test results.

* * * * *